(12) United States Patent
Huang et al.

(10) Patent No.: US 6,655,908 B2
(45) Date of Patent: Dec. 2, 2003

(54) HEAT-DISSIPATING ASSEMBLY

(75) Inventors: Wen-Shi Huang, Taoyuan (TW); Kuo-Cheng Lin, Taoyuan (TW); Chen-Chang Lin, Taipei (TW)

(73) Assignee: Delta Electronics Inc., Taoyuan Hsien (TW)

( * ) Notice: Subject to any disclaimer, the term of this patent is extended or adjusted under 35 U.S.C. 154(b) by 0 days.

(21) Appl. No.: 10/125,539

(22) Filed: Apr. 19, 2002

(65) Prior Publication Data

US 2002/0127099 A1 Sep. 12, 2002

Related U.S. Application Data

(63) Continuation-in-part of application No. 09/797,747, filed on Mar. 1, 2001.

(51) Int. Cl.⁷ .............................................. F04D 29/60
(52) U.S. Cl. ..................... 415/53.1; 415/60; 415/213.1; 416/244 R
(58) Field of Search ............................ 415/53.1, 213.1, 415/214.1, 22.4, 203, 206, 199.1, 66, 220, 223; 416/244 R, 198 R (56) References Cited

U.S. PATENT DOCUMENTS

| | | | | |
|---|---|---|---|---|
| 5,772,500 A | * | 6/1998 | Harvey et al. | 454/184 |
| 6,042,474 A | * | 3/2000 | Harvey et al. | 454/184 |
| 6,252,770 B1 | * | 6/2001 | Yu et al. | 361/695 |

* cited by examiner

*Primary Examiner*—Edward K. Look
*Assistant Examiner*—J. M. McAlleenan
(74) *Attorney, Agent, or Firm*—Birch, Stewart, Kolasch & Birch, LLP (57) ABSTRACT

A heat-dissipating assembly includes a plurality of heat-dissipating devices, each of which includes a frame having at least one locating window for allowing the heat-dissipating device to inhale air and discharge airflow, and a stream-guiding wall formed beside the locating window; and at least one blade structure mounted in the locating window of the frame. In addition, each heat-dissipating device further includes at least one engaging medium to be engaged with a corresponding engaging medium of another heat-dissipating device, thereby allowing the plurality of heat-dissipating devices to be combined in parallel, side by side, or in tiers.

23 Claims, 12 Drawing Sheets

HEAT-DISSIPATING ASSEMBLY

The present invention is a continuation-in-part application of the parent application bearing Ser. No. 09/797,749 and filed on Mar. 1, 2001. The present invention relates to a heat-dissipating device, and more particularly to a heat-dissipating assembly.

FIELD OF THE INVENTION

1. Background of the Invention

The basic function of the industrial fan is to ventilate and cool the electrical apparatus. It usually needs one fan to be mounted in the electrical apparatus. The conventional cooling fan has a square and flat shape and has a generally square fan frame. However, some electrical apparatuses such as a router or a hub have a specific overall shape longer, wider or narrower than those of the usual ones. For a relatively bulky electrical apparatus, it will merely perform the cooling and ventilating function in the local area if only one fan is mounted in the electrical apparatus. Thus, it needs to mount multiple fans in the wide side of the electrical apparatus; otherwise it does not reach the purpose of effectively ventilating and cooling.

Figure 1:
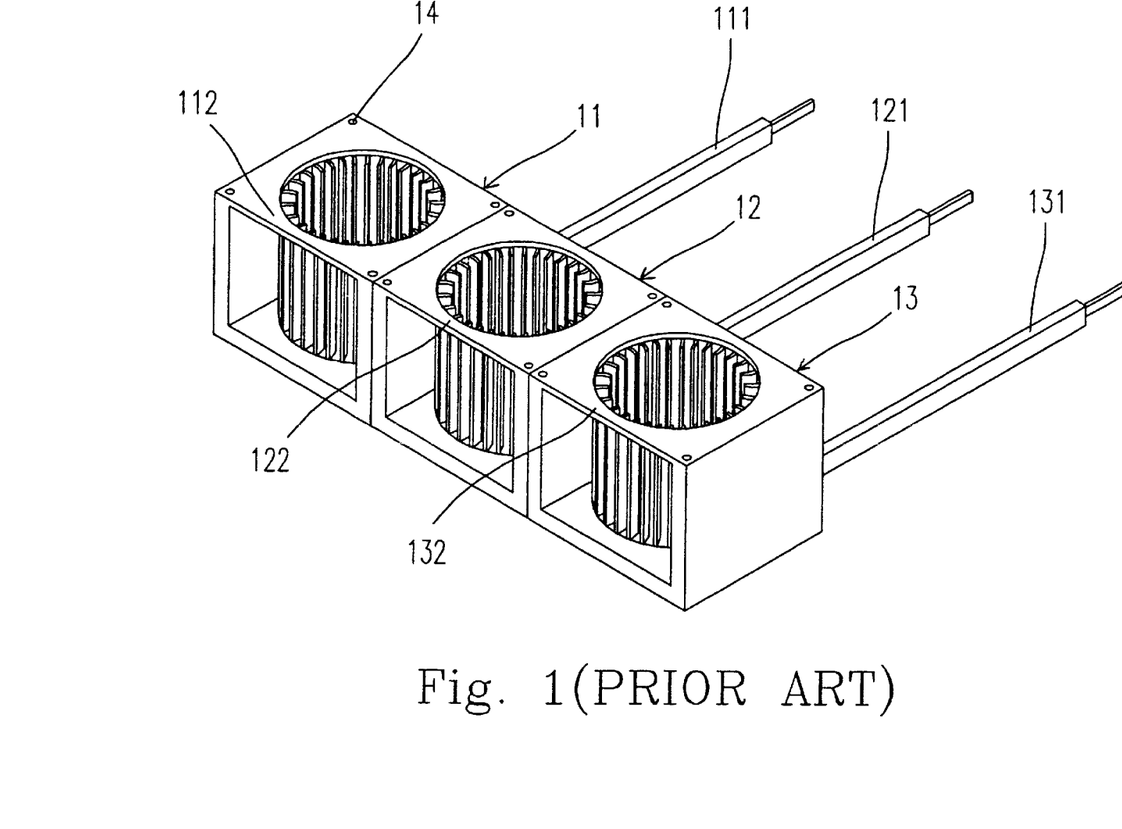
FIG. 1 is a schematic diagram showing an architecture of the conventional heat-dissipating assembly.

FIG. 1 is a schematic diagram showing an architecture of the conventional fan assembly. The three fan devices 11, 12, 13 respectively are independent fan units and respectively have fan frames 112, 122, 132 and pairs of power lines 111, 121, 131. In addition, each fan has four holes 14 on the respective fan frame for allowing the corresponding screws to be fixed tightly onto the electrical apparatus.

Presently, the assembling method of the ventilating and cooling fan devices in the electrical apparatus is to fix the multiple conventional fan frames one by one to the electrical apparatus by screws. It has a less elasticity of assembly. Moreover, it uses lots of screws for fixing the multiple conventional fan frames onto the electrical apparatus and hence it costs much unnecessary manufacturing cost and assembling time. In addition, each fan frame has an external pair of power lines. When the multiple fan frames are mounted in the electrical apparatus, there are many external pairs of power lines used in the electrical apparatus. As known, it is a trouble to arrange these external power lines and handle the entwining external power lines in the electrical apparatus.

It is therefore tried by the applicant to deal with the above-described situations encountered by the prior art.

SUMMARY OF THE INVENTION

It is therefore an object of the present invention to provide an architecture for a heat-dissipating assembly, in which the hardware assembling cost and time can be reduced by using fewer screws and using an engaging assembling method.

It is another object of the present invention to provide a heat-dissipating device which has a stream-guiding wall and can be assembled with another heat-dissipating device in parallel or in tiers.

It is a further object of the present invention to provide an architecture for a heat-dissipating assembly having a flexible assembling form.

It is still an object of the present invention to provide an assembling method for simplifying the power lines collection of multiple heat-dissipating devices.

It is an additional object of the present invention to provide an architecture for a heat-dissipating assembly having a fancy assembling type of multiple heat-dissipating devices.

It is another yet object of the present invention to provide an architecture for a heat-dissipating assembly, in which a specific heat-dissipating device can be replaced when the specific heat-dissipating device is failed.

According to the present invention, a heat-dissipating assembly includes a first heat-dissipating device having an engaging medium, and a second heat-dissipating device having a corresponding engaging medium for being engaged with the engaging medium of the first heat-dissipating device, thereby allowing the second heat-dissipating device to be combined with the first heat-dissipating device.

Certainly, the first heat-dissipating device can further include an additional engaging medium for being engaged with a corresponding engaging medium of a third heat-dissipating device, thereby allowing the third heat-dissipating device to be combined with the first heat-dissipating device.

Certainly, the second heat-dissipating device can further include an additional engaging medium for being engaged with a corresponding engaging medium of a fourth heat-dissipating device, thereby allowing the fourth heat-dissipating device to be combined with the second heat-dissipating device.

Certainly, each of the first heat-dissipating device, the second heat-dissipating device, the third heat-dissipating device and the fourth heat-dissipating device can be a centrifugal fan, an axial-flow fan or a cross fan, respectively.

Preferably, the engaging medium of the first heat-dissipating device is a protruding piece and the corresponding engaging medium of the second heat-dissipating device is a concavity.

Generally, the heat-dissipating assembly of the present invention is constructed by a plurality of heat-dissipating devices combined in parallel.

Generally, the heat-dissipating assembly of the present invention is constructed by a plurality of heat-dissipating devices combined vertically in parallel.

According to one aspect of the present invention, a heat-dissipating device includes a frame having at least one locating window for allowing the heat-dissipating device to inhale air and discharge airflow, and a stream-guiding wall formed beside the locating window; and at least one blade structure mounted in the locating window of the frame. The locating window has an inlet and an outlet, respectively disposed in the first plane and the second plane. The first plane and the second plane can be perpendicular to each other, or parallel with each other.

Preferably, the stream-guiding wall is disposed beside the inlet of the locating window.

According to another aspect of the present invention, a heat-dissipating assembly includes a plurality of heat-dissipating devices, each of which includes a frame having at least one locating window for allowing the heat-dissipating device to inhale air and discharge airflow, and a stream-guiding wall formed beside the locating window; and at least one blade structure respectively mounted in the locating window of the frame.

The present invention may best be understood through the following descriptions with reference to the accompanying drawings, in which:

DETAILED DESCRIPTION OF THE PREFERRED EMBODIMENTS

The present invention will now be described more detailedly with reference to the following embodiment. It is to be noted that the following descriptions of the preferred embodiments of this invention are presented herein for the purpose of illustration and description only. It is not intended to be exhaustive or to be limited to the precise from disclosed.

Figure 2A:
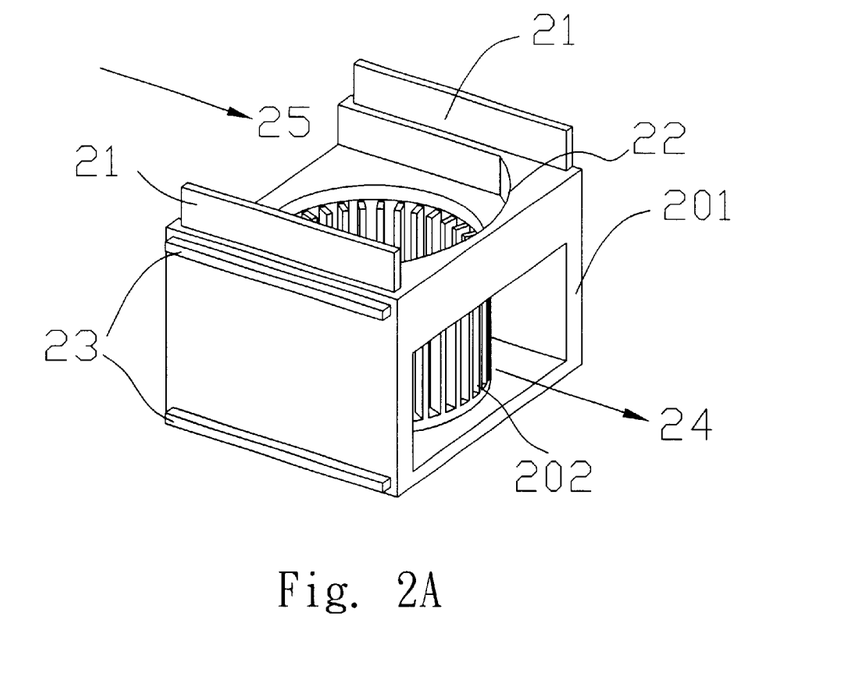
FIGS. 2A and 2B are schematic diagrams showing a preferred embodiment of the architecture for a heat-dissipating device in two different states according to the present invention.
Figure 2B:
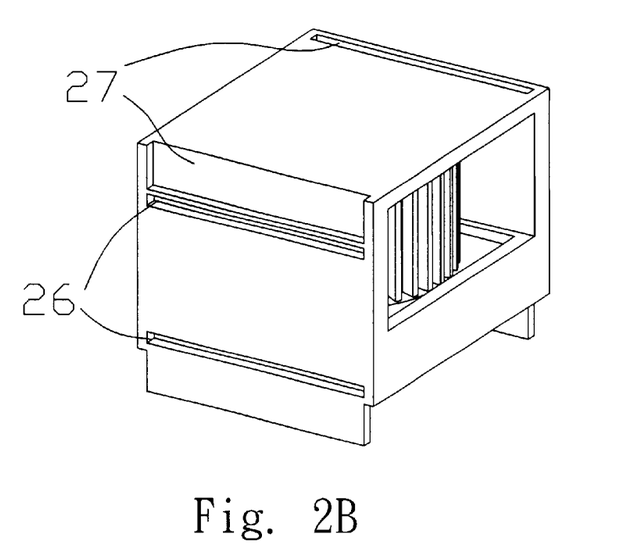

FIG. 2A and FIG. 2B show an architecture of a heat-dissipating device according to the present invention in differently placed views, respectively. In the illustration of FIG. 2A, the heat-dissipating device includes a frame 21 having a locating window 201, and a blade structure 202 mounted in the locating window. The locating window has an inlet 25, and an outlet 24 for allowing the heat-dissipating device to inhale air from the inlet and discharge airflow from the outlet. The inlet 25 and the outlet 24 are disposed in the first plane and the second plane, respectively. In this instance, the first plane and the second plane are perpendicular to each other and this heat-dissipating device is a centrifugal fan. Alternatively, the inlet 25 and the outlet 24 can also be disposed in two planes which are parallel with each other and the heat-dissipating device is an axial-flow fan.

The frame 21 of the heat-dissipating device further includes a stream-guiding wall 22 disposed beside the inlet. Not only can the stream-guiding wall prevent airflow reflux to increase the heat-dissipating performance, but reinforce the architecture of the heat-dissipating device.

In addition, the frame 21 of the heat-dissipating device has upper protruding pieces 21 and left protruding pieces 23 as shown in FIG. 2A and also includes right concavities 26 and lower concavities 27 as shown in FIG. 2B. These protruding pieces and concavities can be used as the engaging media and the corresponding engaging media. These media can be used to assemble together a plurality of the same heat-dissipating device to construct a diversiform heat-dissipating assembly such as side-by-side, overlapped series or fancy form. In addition, the power lines of the heat-dissipating device can pass to the next heat-dissipating device through the protruding pieces and the concavities in the heat-dissipating devices. It can minimize the assemblage complexity of the external pairs of power lines. The outward forms of the protruding pieces annd the concavities in the heat-dissipating device can be redesigned to be adapted to different requirements.

Figure 3A:
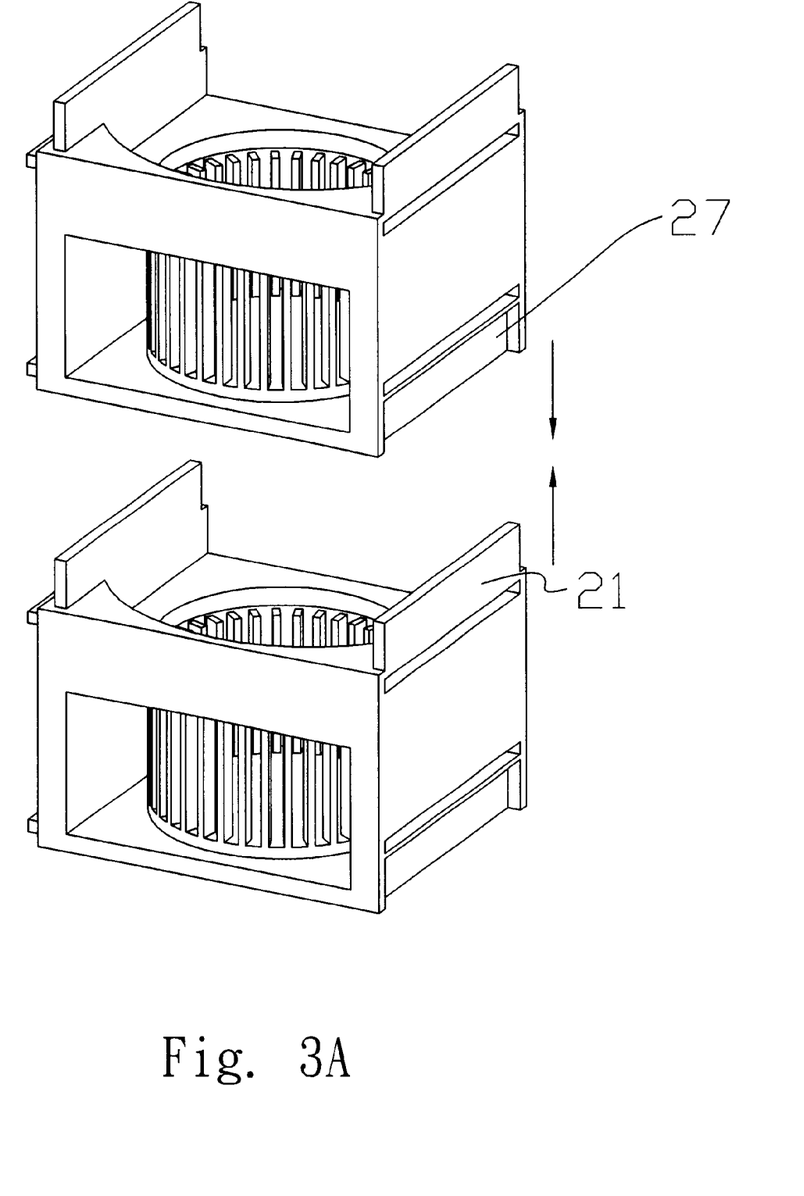
FIGS. 3A and 3B are schematic diagrams respectively showing the first preferred embodiment of a heat-dissipating assembly constructed before and after a heat-dissipating device is combined with another one vertically in parallel according to the present invention.
Figure 3B:
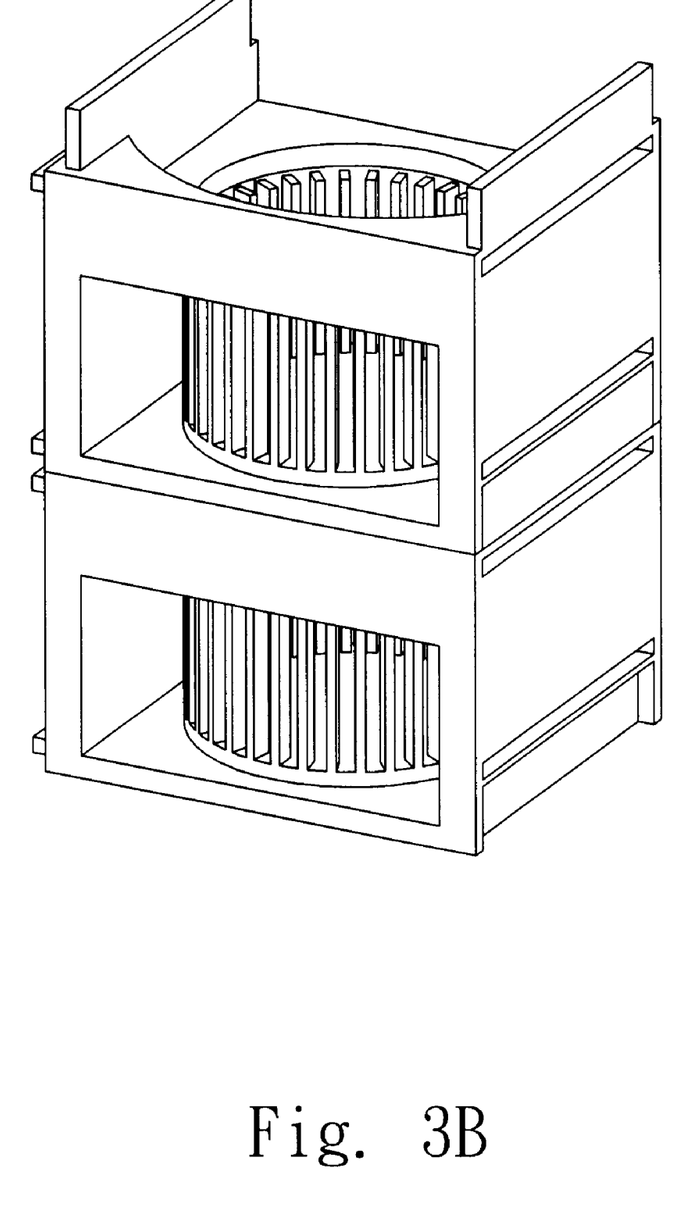

FIGS. 3A and 3B are schematic diagrams respectively showing an architecture of a heat-dissipating assembly constructed before and after a heat-dissipating device is combined with another one vertically in parallel. As shown in FIG. 3A, the lower concavities 27 of the upper heat-dissipating device can be engaged with the upper protruding pieces 21 of the lower heat-dissipating device to form the combined form of two heat-dissipating devices overlapped as shown in FIG. 3B.

Figure 4A:
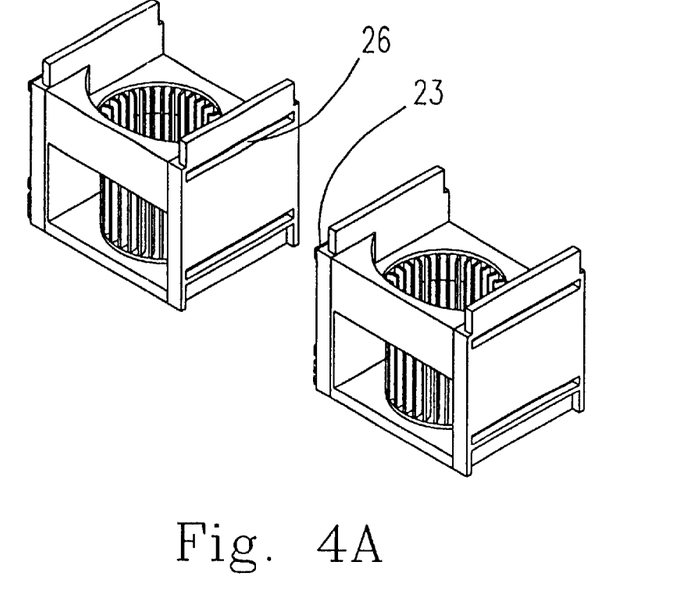
FIGS. 4A and 4B are schematic diagram respectively showing the second preferred embodiment of a heat-dissipating assembly constructed before and after a heat-dissipating device is combined with another one in parallel according to the present invention.
Figure 4B:
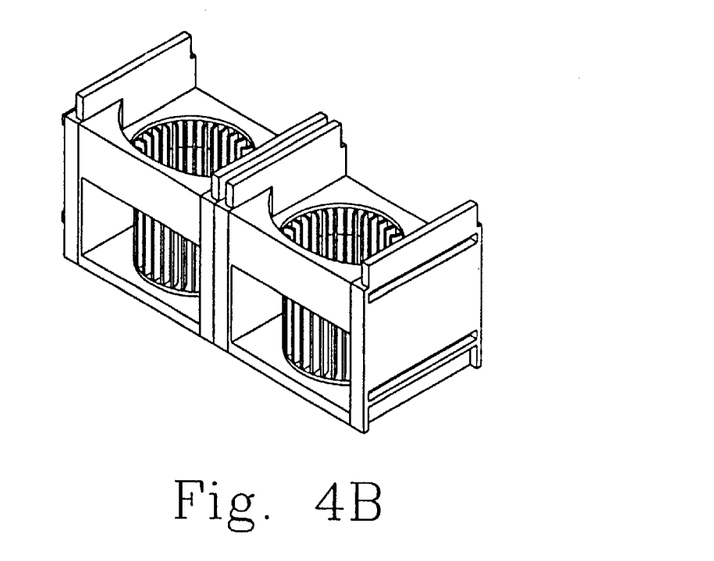

FIG. 4A and FIG. 4B are schematic diagrams respectively showing the heat-dissipating assembly constructed before and after a heat-dissipating device is combined with another one side by side. As shown in FIG. 4A, the left protruding pieces 23 of the right heat-dissipating device can be engaged with the right concavities 26 of the left heat-dissipating device to form the combined form of two heat-dissipating devices as shown in FIG. 4B.

Figure 5:
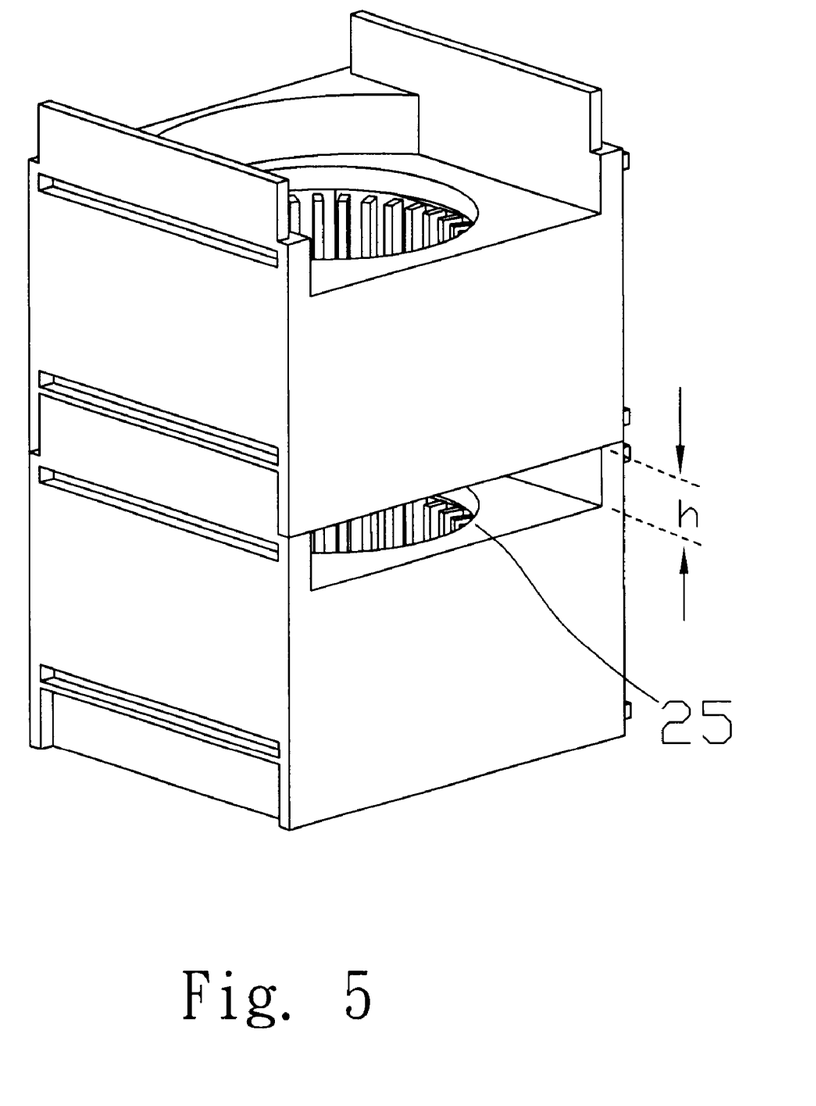
FIG. 5 is a schematic diagram showing an inlet of the heat-dissipating assembly of FIG. 3 according to the present invention.

Referring to FIG. 5, when two heat-dissipating devices are overlapped, there is the inlet 25 having a height h formed between the two heat-dissipating devices. Therefore, this combining way will not interfere the performance of the ventilating and cooling function.

Figure 6:
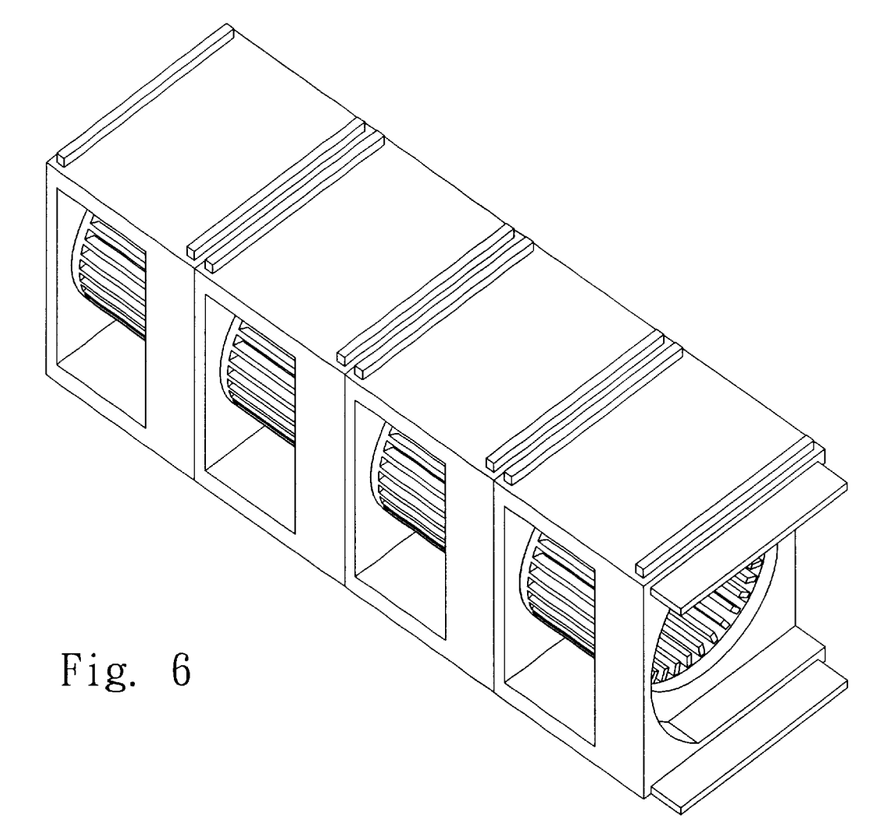
FIG. 6 is a schematic diagram showing the third preferred embodiment of a heat-dissipating assembly constructed by combining multiple heat-dissipating devices vertically in parallel according to the present invention.
Figure 7:
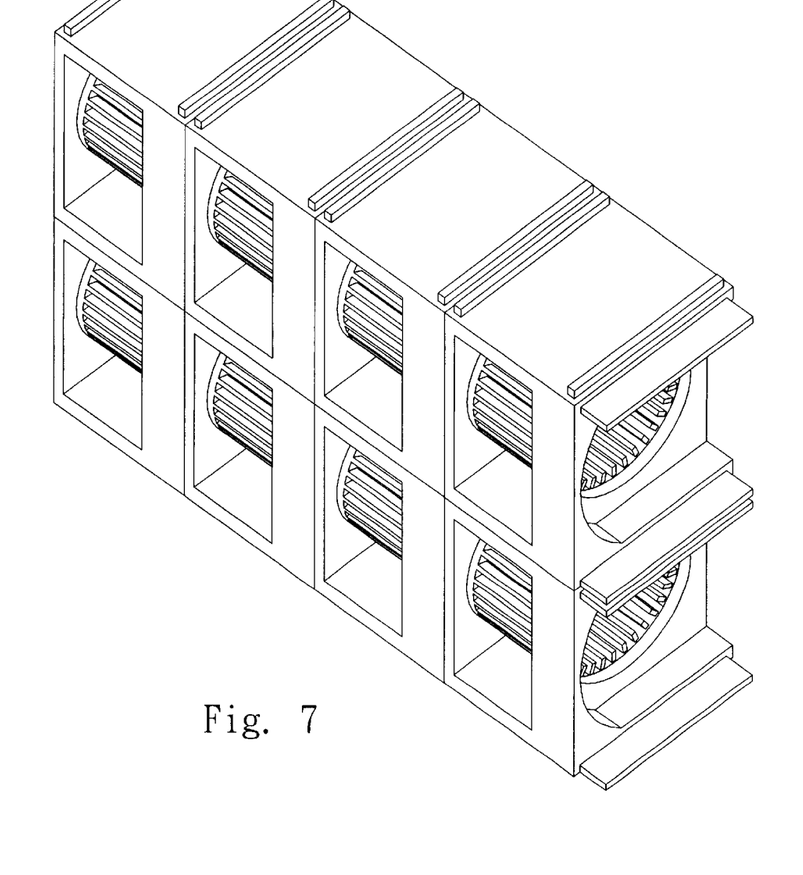
FIG. 7 is a schematic diagram showing the fourth preferred embodiment of a heat-dissipating assembly constructed by combining multiple heat-dissipating devices in tiers according to the present invention.
Figure 8:
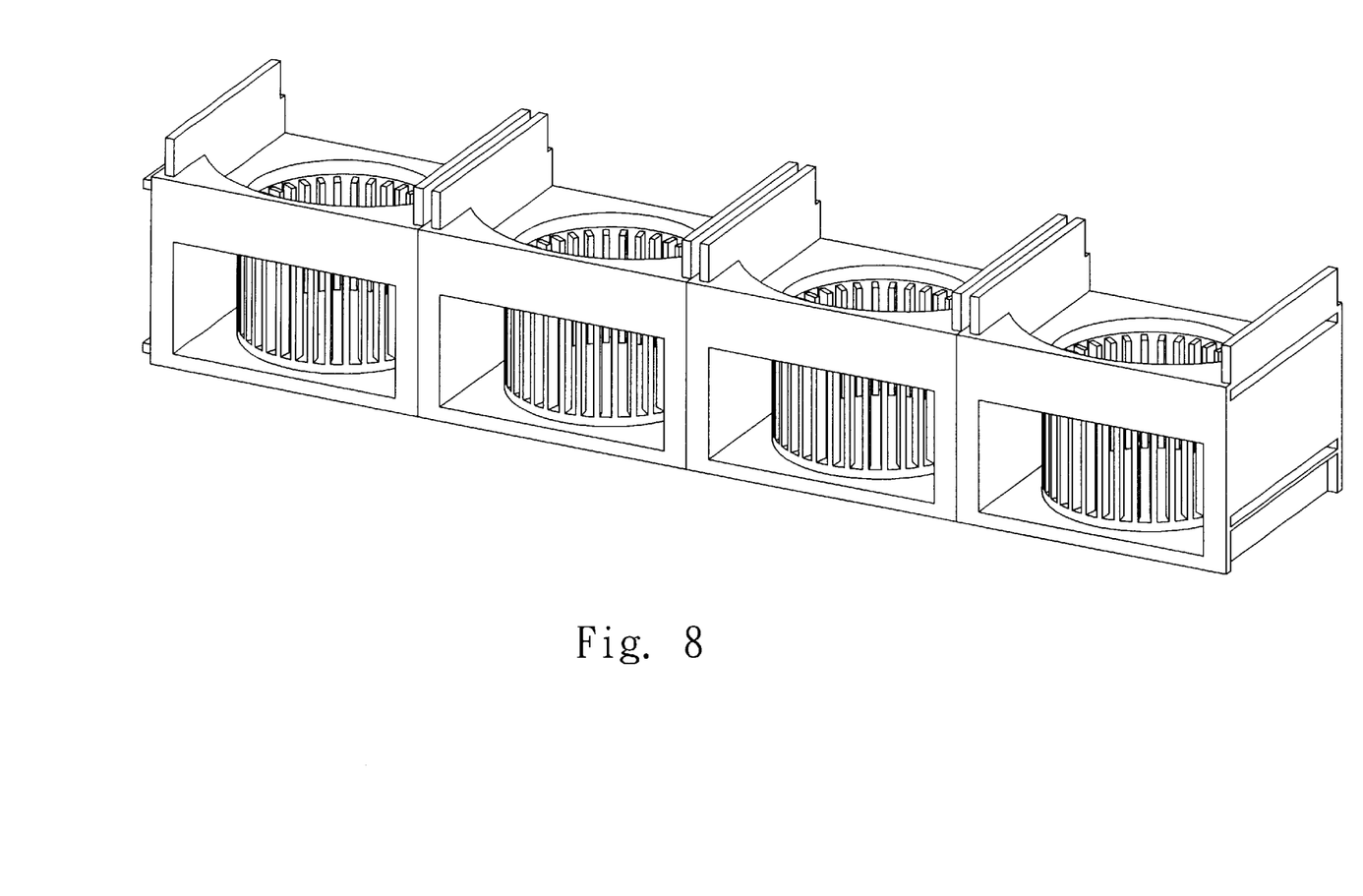
FIG. 8 is a schematic diagram showing the fifth preferred embodiment of a heat-dissipating assembly constructed by combining multiple heat-dissipating devices side by side according to the present invention.
Figure 9:
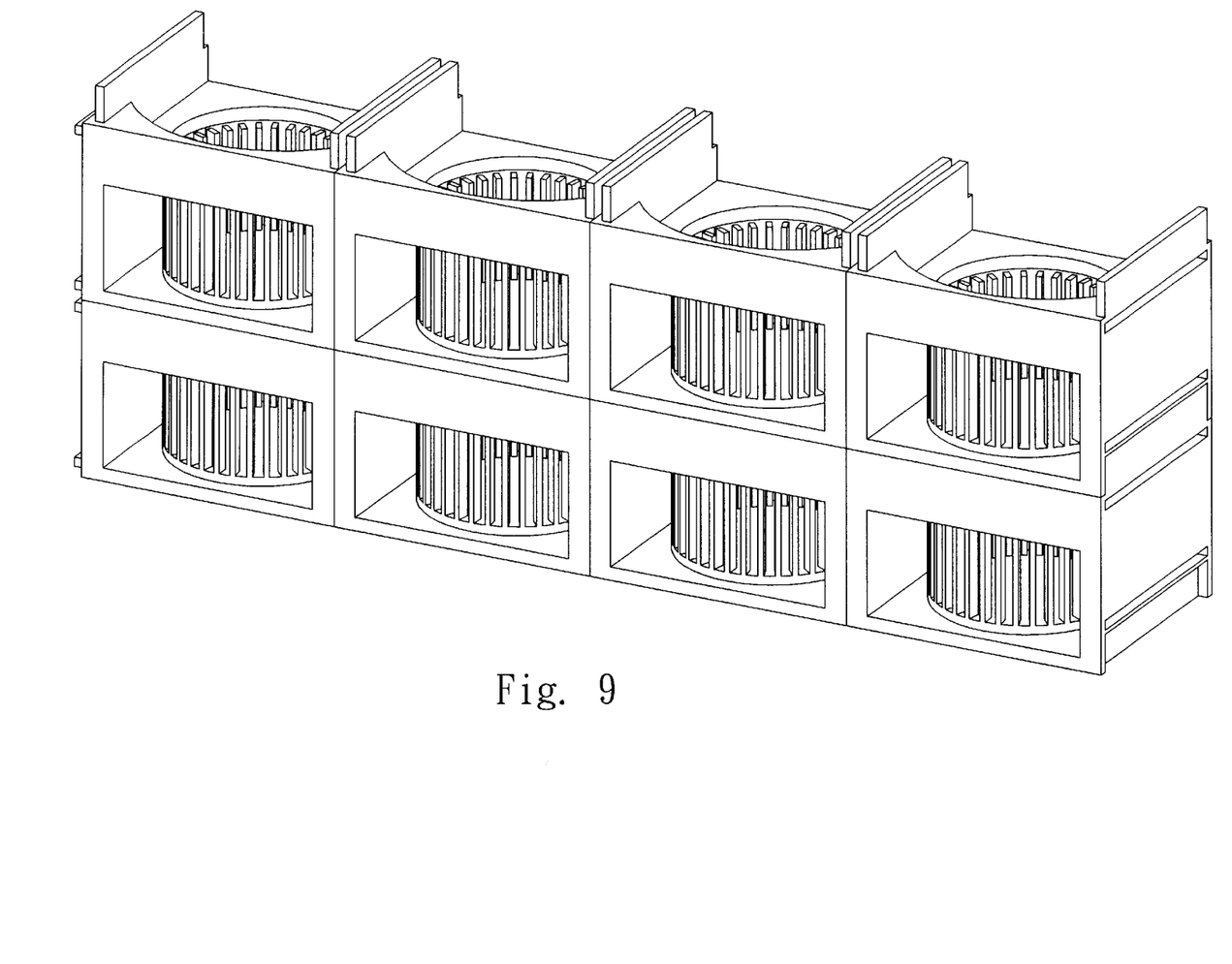
FIG. 9 is a schematic diagram showing the sixth preferred embodiment of a heat-dissipating assembly constructed by multiple tiers of multiple heat-dissipating devices according to the present invention.
Figure 10:
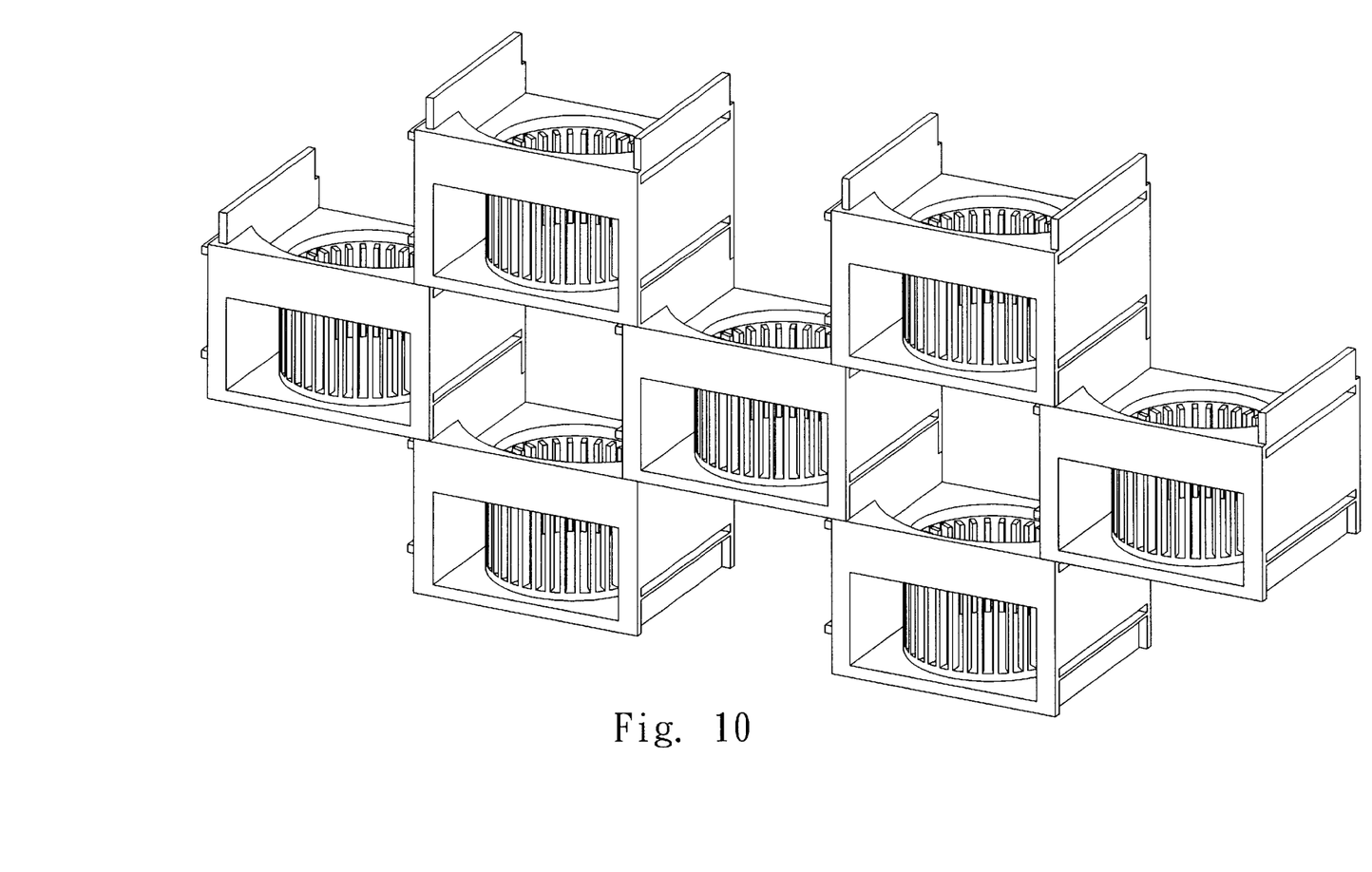
FIG. 10 is a schematic diagram showing the seventh preferred embodiment of a heat-dissipating assembly of a fancy assembling form according to the present invention.

FIG. 6 shows an assembly of four heat-dissipating devices, each of which is vertically overlapped with the other. FIG. 7 shows the combination of two tiers of the heat-dissipating assembly shown in FIG. 6. FIG. 8 shows another assembly of four heat-dissipating devices, wherein each heat-dissipating device is connected to one another side by side. As to FIG. 9, it is the combination of two tiers of the heat-dissipating assembly shown in FIG. 8. Finally, FIG. 10 shows a fancy assembly of multiple heat-dissipating devices, wherein each heat-dissipating device is connected to one another at random for some purposes. In the instances described above, the heat-dissipating devices are exemplified as centrifugal fans. Additionally, the heat-dissipating devices can also be axial-flow fans or cross fans. Furthermore, each heat-dissipating device can be connected to one another on all sides.

Figure 11:
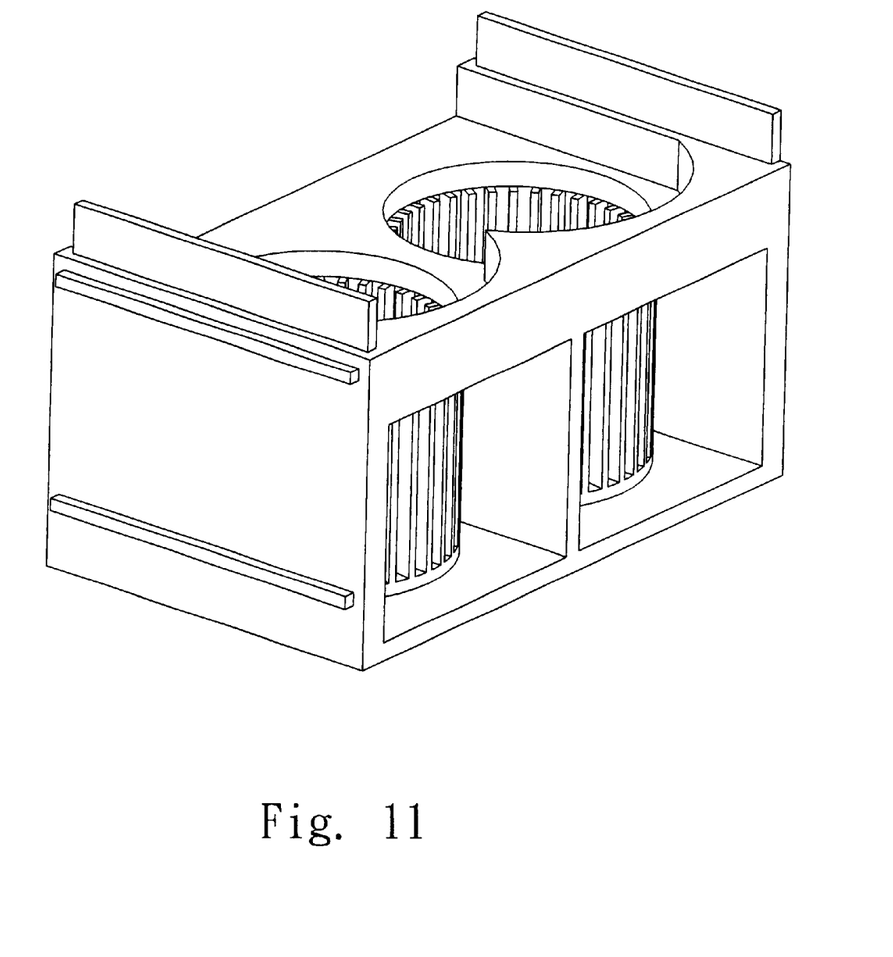
FIG. 11 is a schematic diagram showing another preferred embodiment of the architecture for a heat-dissipating device according to the present invention.

In addition to the above-described heat-dissipating devices, it can also be designed as that a plurality of blade structures are respectively disposed in a plurality of locating windows formed in a single frame (that is, an integrally formed frame) as shown in FIG. 11. Similarly, this frame also has an engaging medium to be engaged with a corresponding engaging medium of the frame of another identical heat-dissipating device, and includes a stream-guiding wall disposed beside the inlet of the locating window to prevent airflow reflux for increasing the heat-dissipating performance, but reinforce the architecture of the heat-dissipating device.

In conclusion, the present invention has a plurality of heat-dissipating devices whose frames include an engaging medium adapted to be engaged with a corresponding engaging medium of the frame of another heat-dissipating device. They can be combined to a random type design. The engaging medium can be a protruding piece and the corresponding engaging medium can be a concavity. Therefore, the present invention provides an improved heat-dissipating assembly which is capable of providing a flexible assembly and can use fewer screws for fixing and assembling so that it is no more like the inflexible and inconvenient conventional assembling form and can minimize the manufacturing cost and the assembling time. For this reason, the heat-dissipating assembly of the present invention has a convenient maintaining predominance because a new heat-dissipating device can be used to replace the specific broken one when one heat-dissipating device of the heat-dissipating assembly is broken. Moreover, the present application also provides an improved assembling method for the multiple pairs of power lines of a heat-dissipating assembly formed by multiple heat-dissipating devices. The pairs of power lines of a heat-dissipating device can pass to the next heat-dissipating device through the protruding pieces and the concavities in the heat-dissipating devices so as to lead the multiple power lines, minimize the assemblage complexity and avoid the entwining problem of the external pairs of power lines.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claimed is:

1. A heat-dissipating device comprising:
   a frame having at least one locating window for allowing said heat-dissipating device to inhale air and discharge airflow, and a stream-guiding wall formed beside said at least one locating window; and
   at least one blade structure mounted in said at least one locating window of said frame.

2. The heat-dissipating device according to claim 1 wherein said locating window has an inlet and an outlet, respectively disposed in the first plane and the second plane.

3. The heat-dissipating device according to claim 2 wherein said first plane and said second plane are perpendicular to each other.

4. The heat-dissipating device according to claim 3 wherein said heat-dissipating device is a centrifugal fan.

5. The heat-dissipating device according to claim 2 wherein said inlet and said outlet are disposed in two planes which are parallel with each other.

6. The heat-dissipating device according to claim 5 wherein said heat-dissipating device is an axial-flow fan.

7. The heat-dissipating device according to claim 2 wherein said stream-guiding wall is disposed beside said inlet of said locating window.

8. The heat-dissipating device according to claim 1 wherein said heat-dissipating device is one selected from a group consisting of a centrifugal fan, an axial-flow fan and a cross fan.

9. The heat-dissipating device according to claim 1 wherein said frame further includes a first engaging medium to be engaged with a first corresponding engaging medium of a frame of another heat-dissipating device.

10. The heat-dissipating device according to claim 9 wherein said first engaging medium is a protruding piece and said first corresponding engaging medium is a concavity.

11. The heat-dissipating device according to claim 9, wherein said frame further includes a second engaging medium to be engaged with a second corresponding engaging medium of another heat-dissipating frame of another heat-dissipating device.

12. A heat-dissipating assembly comprising:
    a plurality of heat-dissipating devices, each of which includes:
        a frame having a locating window for allowing said heat-dissipating device to inhale air and discharge airflow, and a stream-guiding wall formed beside said locating window; and
        a blade structure mounted in said locating window of said frame.

13. The heat-dissipating assembly according to claim 12 wherein said locating window has an inlet and an outlet, respectively disposed in the first plane and the second plane.

14. The heat-dissipating assembly according to claim 13 wherein said first plane and said second plane are perpendicular to each other.

15. The heat-dissipating assembly according to claim 14 wherein said heat-dissipating device is a centrifugal fan.

16. The heat-dissipating assembly according to claim 13 wherein said inlet and said outlet are disposed in two planes which are parallel with each other.

17. The heat-dissipating assembly according to claim 16 wherein said heat-dissipating device is an axial-flow fan.

18. The heat-dissipating assembly according to claim 12 wherein said heat-dissipating device further includes at least one engaging medium to be engaged with a corresponding engaging medium of a frame of another heat-dissipating device.

19. The heat-dissipating assembly according to claim 18 wherein said engaging medium is a protruding piece and said corresponding engaging medium is a concavity.

20. A heat-dissipating device comprising:
    a single frame having a plurality of locating windows for allowing said heat-dissipating device to inhale air and discharge airflow; and
    a plurality of blade structures respectively mounted in said locating windows.

21. The heat-dissipating device according to claim 20 wherein said frame further includes at least one engaging medium to be engaged with a corresponding engaging medium of a frame of another heat-dissipating device.

22. The heat-dissipating device according to claim 20 wherein said frame further includes a stream-guiding wall formed beside said plurality of locating windows.

23. A heat-dissipating assembly comprising:
    a plurality of heat-dissipating devices, each of which includes:
        a frame having a locating window for allowing said heat-dissipating device to take in and exhaust airflow, and a stream-guiding wall formed beside said locating window;
        a blade structure mounted in said locating window of said frame; and
        an engaging medium for engagement with a corresponding engaging medium of a frame of another heat-dissipating device.

* * * * *